(12) United States Patent
Takamine et al.

(10) Patent No.: US 10,778,187 B2
(45) Date of Patent: Sep. 15, 2020

(54) SURFACE ACOUSTIC WAVE FILTER AND MULTIPLEXER

(71) Applicant: Murata Manufacturing Co., Ltd., Nagaokakyo-shi, Kyoto-fu (JP)

(72) Inventors: Yuichi Takamine, Nagaokakyo (JP); Hideki Iwamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/386,298

(22) Filed: Apr. 17, 2019

(65) Prior Publication Data

US 2019/0245519 A1    Aug. 8, 2019

Related U.S. Application Data

(63) Continuation of application No. PCT/JP2017/038018, filed on Oct. 20, 2017.

(30) Foreign Application Priority Data

Nov. 18, 2016 (JP) ................. 2016-225528

(51) Int. Cl.
   *H03H 9/54* (2006.01)
   *H03H 9/64* (2006.01)
   (Continued)

(52) U.S. Cl.
   CPC ........ *H03H 9/725* (2013.01); *H03H 9/02559* (2013.01); *H03H 9/02574* (2013.01);
   (Continued)

(58) Field of Classification Search
   CPC .. H03H 9/25; H03H 9/54; H03H 9/64; H03H 9/72
   (Continued)

(56) References Cited

U.S. PATENT DOCUMENTS 7,626,314 B2 * 12/2009 Kadota .............. H03H 9/02551
                                                  310/313 A
9,621,128 B2 *  4/2017 Iwamoto .............. H03H 9/0222
(Continued)

FOREIGN PATENT DOCUMENTS

JP    2014-526847 A   10/2014
JP    2016-184900 A   10/2016
WO    2012/086639 A1   6/2012

OTHER PUBLICATIONS

Official Communication issued in International Patent Application No. PCT/JP2017/038018, dated Dec. 26, 2017.

*Primary Examiner* — Dean O Takaoka
(74) *Attorney, Agent, or Firm* — Keating & Bennett, LLP

(57) ABSTRACT

A filter includes a LiTaO$_3$ piezoelectric layer having a cut angle, a high acoustic velocity support substrate, a low acoustic velocity film, and an IDT electrode. A cut angle $\theta_B$ of the piezoelectric layer at which a Rayleigh wave spurious response is locally reduced or minimized is determined from a wavelength of the IDT electrode, a film thickness of the IDT electrode, a specific gravity of the IDT electrode, an electrode duty, a thickness of the piezoelectric layer, and a film thickness of the low acoustic velocity film. The Cut angle of the piezoelectric layer satisfies a relationship of $\theta_B-4 \leq \theta \leq \theta_B+4$.

20 Claims, 7 Drawing Sheets

(51) Int. Cl.
*H03H 9/72* (2006.01)
*H03H 9/02* (2006.01)
*H03H 9/145* (2006.01)

(52) U.S. Cl.
CPC .......... *H03H 9/14538* (2013.01); *H03H 9/54* (2013.01); *H03H 9/6483* (2013.01)

(58) Field of Classification Search
USPC .................................................. 333/133, 193
See application file for complete search history.

(56) References Cited

U.S. PATENT DOCUMENTS

| | | | |
|---|---|---|---|
| 10,097,158 B2 * | 10/2018 | Kaneda ............... | H03H 9/14591 |
| 2013/0285768 A1 * | 10/2013 | Watanabe ................ | H03H 3/02 |
| | | | 333/193 |
| 2014/0329475 A1 | 11/2014 | Ella et al. | |
| 2016/0268997 A1 * | 9/2016 | Komatsu ............ | H03H 9/02559 |
| 2016/0285431 A1 | 9/2016 | Nakahashi et al. | |

* cited by examiner

SURFACE ACOUSTIC WAVE FILTER AND MULTIPLEXER

CROSS REFERENCE TO RELATED APPLICATIONS

This application claims the benefit of priority to Japanese Patent Application No. 2016-225528 filed on Nov. 18, 2016 and is a Continuation Application of PCT Application No. PCT/JP2017/038018 filed on Oct. 20, 2017. The entire contents of each application are hereby incorporated herein by reference.

BACKGROUND OF THE INVENTION

1. Field of the Invention

The present invention relates to a surface acoustic wave filter and a multiplexer.

2. Description of the Related Art

Hitherto, a surface acoustic wave filter has been suitably used as a radio frequency filter for a communication terminal. In this connection, an improvement in the Q-value of an acoustic wave resonator is demanded especially in a frequency band at which a frequency interval between a pass band and an elimination band is narrow and advanced filter design techniques are needed, because it is important that a transition region between the pass band and the elimination band has sharp filter characteristics.

International Publication No. 2012/086639 discloses, in FIG. 1, a surface acoustic wave filter in which the Q-value is increased by using a piezoelectric substrate in the form of a multilayer body including a high acoustic velocity support substrate, a low acoustic velocity film, and a piezoelectric layer. Low loss properties of the surface acoustic wave filter can be realized with the above-mentioned configuration.

However, when the surface acoustic wave filter is constructed using the above-described multilayer body, a Rayleigh wave spurious response generates on the lower frequency side than the pass band, and attenuation characteristics on the lower frequency side degrade. In particular, when a multiplexer is constructed using the above-mentioned surface acoustic wave filter, a ripple attributable to the spurious response generates in a pass band of a lower-frequency-side filter that is connected in common to the surface acoustic wave filter.

Using a piezoelectric substrate having a particular cut angle is known as a method capable of suppressing the spurious response. In the surface acoustic wave filter, however, structural parameters of an IDT (InterDigital transducer) electrode and a piezoelectric material have to be optimized depending on the demanded filter characteristics. An optimum cut angle of the piezoelectric substrate changes depending on the structural parameters, and it is not uniquely determined.

SUMMARY OF THE INVENTION

Preferred embodiments of the present invention provide surface acoustic wave filters and multiplexers, the filters each including a piezoelectric layer having a cut angle selected depending on structural parameters of an InterDigital Transducer (IDT) electrode and a piezoelectric material, and enabling an attenuation band on the lower frequency side to be improved while low loss properties in a pass band are ensured.

A surface acoustic wave filter according to a preferred embodiment of the present invention includes a $LiTaO_3$ piezoelectric layer having a cut angle $\theta°$, a high acoustic velocity support substrate in which a bulk wave propagates at a higher acoustic velocity than an acoustic wave propagating in the $LiTaO_3$ piezoelectric layer, a low acoustic velocity film which is between the high acoustic velocity support substrate and the $LiTaO_3$ piezoelectric layer, and in which a bulk wave propagates at a lower acoustic velocity than the acoustic wave propagating in the $LiTaO_3$ piezoelectric film, and an IDT electrode on the $LiTaO_3$ piezoelectric layer, wherein, where a repetition period of a pair of comb-shaped electrodes defining the IDT electrode is denoted by a wavelength $\lambda$ (µm), a film thickness of the pair of comb-shaped electrodes is denoted by $T_{IDT}$ (µm), a specific gravity of the IDT electrode is denoted by $\rho$ (g/cm$^3$), an electrode duty of the pair of comb-shaped electrodes is denoted by D, a thickness of the $LiTaO_3$ piezoelectric layer is denoted by $T_{LT}$ (µm), and a film thickness of the low acoustic velocity film is denoted by $T_{VL}$ (µm), an optimum cut angle $\theta_B(°)$ of the $LiTaO_3$ piezoelectric layer at which a Rayleigh wave spurious response is locally minimized is specified by:

$$\theta_B = 43.09 - 27.5 \times \left\{\left(\frac{T_{IDT}}{\lambda}\right) \times \rho - 0.1956\right\} - $$
$$19.2 \times (D - 0.5) + 17.4578 \times \left\{\left(\frac{T_{LT}}{\lambda}\right) - 0.35\right\} +$$
$$5.619 \times \left\{\left(\frac{T_{VL}}{\lambda}\right) - 0.3\right\} + 32.66 \times \left[\left\{\left(\frac{T_{LT}}{\lambda}\right) - 0.35\right\}^2 - 0.0125\right] +$$
$$24.63 \times \left\{\left(\frac{T_{LT}}{\lambda}\right) - 0.35\right\} \times \left\{\left(\frac{T_{VL}}{\lambda}\right) - 0.3\right\}$$

and, the cut angle $\theta(°)$ of the $LiTaO_3$ piezoelectric layer satisfies a relationship of:

$\theta_B - 4 \leq \theta \leq \theta_B + 4$.

As a result of conducting intensive studies, the inventors of preferred embodiments of the present invention have discovered that, in a surface acoustic wave filter using the piezoelectric layer made of $\theta°$ Y cut X SAW propagation $LiTaO_3$ (of which surface is given by a plane having a normal line defined as an axis resulting from rotating a Y axis toward a Z axis through $\theta°$ with an X axis being a center axis, and in which a surface acoustic wave propagates in an X-axis direction), a cut angle $\theta$ at which the occurrence of the Rayleigh wave spurious response in an attenuation band on the lower frequency side than the pass band is able to be reduced or prevented is not uniquely determined and is changed depending on the wavelength $\lambda$ representing the repetition period, the film thickness $T_{IDT}$ of the comb-shaped electrodes, the specific gravity $\rho$ of the IDT electrode, the electrode duty D of the comb-shaped electrodes, the thickness $T_{LT}$ of the $LiTaO_3$ piezoelectric layer, and the film thickness $T_{VL}$ of the low acoustic velocity film, and that the cut angle $\theta$ can be specified from the above formulas.

Thus, the cut angle $\theta$ of the $LiTaO_3$ piezoelectric layer is able to be selected depending on the structural parameters of the IDT electrode and the piezoelectric material, and the Rayleigh wave spurious response in the attenuation band on the lower frequency side than the pass band is able to be reduced.

A surface acoustic wave filter according to a preferred embodiment of the present invention may include a ladder filter structure defined by a serial arm resonator and a parallel arm resonator each including the LiTaO$_3$ piezoelectric layer and the IDT electrode.

The above feature achieves the surface acoustic wave filter in which low loss properties in the pass band are ensured.

A surface acoustic wave filter according to a preferred embodiment of the present invention may have a longitudinally-coupled filter structure in which a plurality of acoustic wave resonators each including the LiTaO$_3$ piezoelectric layer and the IDT electrode are arranged side-by-side in a propagation direction of the acoustic wave.

The above feature makes the surface acoustic wave filter adaptable to filter characteristics that are demanded to have improved attenuation, for example.

A multiplexer according to a preferred embodiment of the present invention includes a common terminal, a first input/output terminal, and a second input/output terminal, and a surface acoustic wave filter according to a preferred embodiment of the present invention connected between the common terminal and the first input/output terminal, and a lower-frequency-side filter connected between the common terminal and the second input/output terminal, and having a pass band on the lower frequency side than a pass band of the surface acoustic wave filter.

With the above features, in the surface acoustic wave filter having a pass band on the higher frequency side, the cut angle θ of the LiTaO$_3$ piezoelectric layer is able to be selected depending on the structural parameters of the IDT electrode and the piezoelectric material, and a spurious response in the pass band of the lower-frequency-side filter is able to be reduced. Furthermore, in the lower-frequency-side filter, a ripple in the pass band is able to be reduced.

The pass band of a surface acoustic wave filter according to a preferred embodiment of the present invention may be a frequency band of LTE (Long Term Evolution) Band41, and the pass band of the lower-frequency-side filter may be a frequency band of LTE Band25.

Frequencies about 0.76 times those of Band41 (pass band: about 2496 to about 2690 MHz) overlap with those of Band25 (transmission band: about 1850 to about 1915 MHz, reception band: about 1930 to about 1995 MHz). In that situation, when the surface acoustic wave filter is applied to Band41 and the lower-frequency-side filter is applied to Band25, the spurious response in a frequency band about 0.76 times the pass band of the surface acoustic wave filter is reduced, such that the ripple in the pass band of the lower-frequency-side filter is able to be reduced. As a result, the multiplexer with a low loss, high attenuation, and high isolation can be realized.

With the surface acoustic wave filters and the multiplexers according to preferred embodiments of the present invention, since the cut angle selected depending on the structural parameters of the IDT electrode and the piezoelectric material is able to be selectively used, the attenuation band on the lower frequency side is able to be improved while the low loss properties in the pass band are ensured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
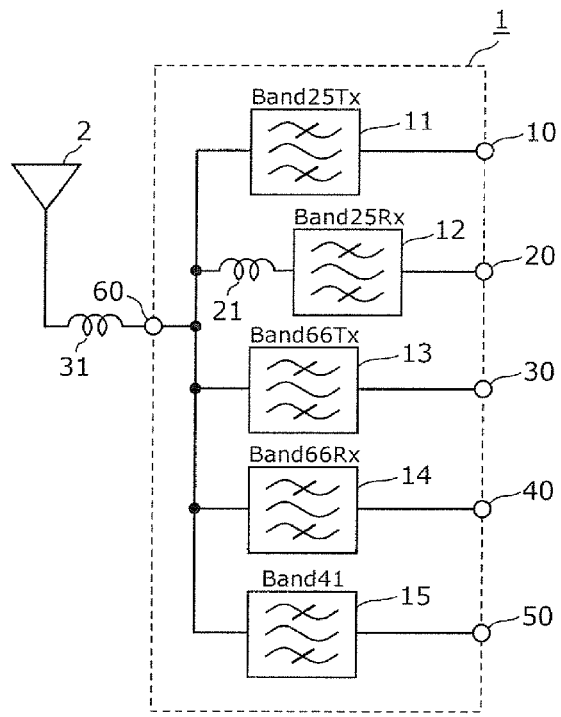
FIG. 1 is a circuit diagram of a multiplexer according to a preferred embodiment of the present invention.

Preferred embodiments of the present invention will be described in detail below with reference to the accompanying drawings and graphs. It is to be noted that any of the following preferred embodiments represents a generic or specific example. Numerical values, shapes, materials, elements, arrangements and connection structures of the elements, etc., which are described in the following preferred embodiments, are merely illustrative, and they are not purported to limit the scope of the present invention. Among the elements in the following preferred embodiments, those not stated in independent Claims are explained as optional elements. Sizes or relative size ratios of the elements illustrated in the drawings are not always exactly true in a strict sense.

PREFERRED EMBODIMENT

A preferred embodiment of the present invention is described, by way of example, in connection with a multiplexer applied to Band25 (transmission band: about 1850 MHz to about 1915 MHz, reception band: about 1930 MHz to about 1995 MHz), Band66 (transmission band: about 1710 MHz to about 1780 MHz, reception band: about 2110 MHz to about 2200 MHz), and Band41 (pass band: about 2496 MHz to about 2690 MHz) according to the LTE (Long Term Evolution) Standards. A multiplexer 1 is preferably, for example, a pentaplexer in which a duplexer for Band25, a duplexer for Band66, and a filter for Band41 are connected at a common terminal.

FIG. 1 is a circuit diagram of the multiplexer 1 according to a preferred embodiment of the present invention. As illustrated in FIG. 1, the multiplexer 1 preferably includes a transmission filter 11 and a reception filter 12 for Band25, a transmission filter 13 and a reception filter 14 for Band66, a filter 15 for Band41, an inductor 21, a common terminal 60, and input/output terminals 10, 20, 30, 40 and 50. The multiplexer 1 is connected to an antenna element 2 via the common terminal 60 and an inductor 31, the inductor 31 being connected in series to the antenna element 2.

The transmission filter 11 is an unbalanced input-unbalanced output band pass filter that receives a transmission wave, which is generated by a transmission circuit (such as an RFIC, for example), via the input/output terminal 10, and that outputs the transmission wave to the common terminal 60 after filtering in the transmission band (about 1850 MHz to about 1915 MHz) of Band25.

The reception filter 12 is an unbalanced input-unbalanced output band pass filter that receives a reception wave input from the common terminal 60, and that outputs the reception wave to the input/output terminal 20 after filtering in the reception band (about 1930 MHz to about 1995 MHz) of Band25. The inductor 21 is connected in series between the reception filter 12 and the common terminal 60. The inductors 21 and 31 are circuit elements that provide impedance matching between the antenna element 2 and each filter, and they are not essential components.

The transmission filter 13 is an unbalanced input-unbalanced output band pass filter that receives a transmission wave, which is generated by the transmission circuit (such as an RFIC, for example), via the input/output terminal 30, and that outputs the transmission wave to the common terminal 60 after filtering in the transmission band (about 1710 MHz to about 1780 MHz) of Band66.

The reception filter 14 is an unbalanced input-unbalanced output band pass filter that receives a reception wave input from the common terminal 60, and that outputs the reception wave to the input/output terminal 40 after filtering in the reception band (about 2110 MHz to about 2200 MHz) of Band66.

The filter 15 is an unbalanced input-unbalanced output band pass filter that receives a reception wave input from the common terminal 60, and that outputs the reception wave to the input/output terminal 50 after filtering in the pass band (about 2496 MHz to about 2690 MHz) of Band41.

The transmission filters 11 and 13, the reception filters 12 and 14, and the filter 15 are connected in common to the common terminal 60.

The multiplexer according to preferred embodiments of the present invention is not limited to the above-described pentaplexer for Band25+Band66+Band41, and the present invention may be further applied to multiplexers in combination of other bands.

Figure 2:
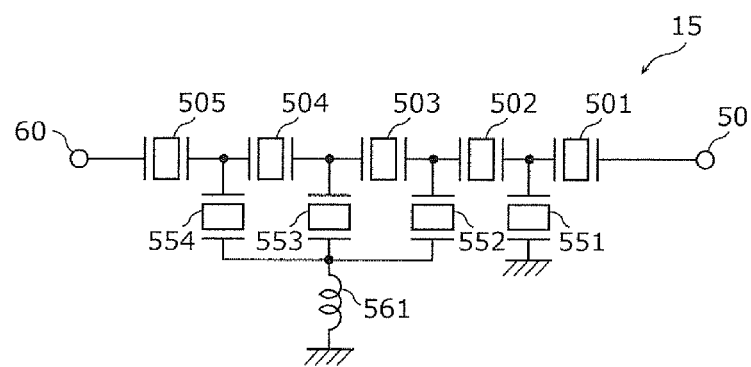
FIG. 2 is a circuit diagram of a filter for Band41 according to a preferred embodiment of the present invention.

FIG. 2 is a circuit diagram of the filter 15 for Band41 according to the present preferred embodiment. As illustrated in FIG. 2, the filter 15 includes serial arm resonators 501 to 505, parallel arm resonators 551 to 554, and a matching inductor 561.

The serial arm resonators 501 to 505 are connected in series in a path connecting the common terminal 60 and the input/output terminal 10. The parallel arm resonators 551 to 554 are connected between individual nodes in the path and a ground. With that connection configuration of the serial arm resonators 501 to 505 and the parallel arm resonators 551 to 554, the filter 15 defines a ladder band pass filter. The inductor 561 is connected between a common junction point of the parallel arm resonators 552, 553 and 554 and the ground. With the above-described ladder circuit configuration, a surface acoustic wave filter is able to be achieved in which low loss properties in the pass band are ensured.

The filter 15 may preferably have, for example, a longitudinally-coupled filter structure including a plurality of surface acoustic wave resonators arranged side-by-side in the propagation direction of an acoustic wave. Such a filter structure is adaptable for filter characteristics that are demanded to have improved attenuation, for example.

The transmission filters 11 and 13 and the reception filters 12 and 14 are each preferably a surface acoustic wave filter defined by acoustic wave resonators, for example. Alternatively, the transmission filters 11 and 13 and the reception filters 12 and 14 may each be an acoustic wave filter utilizing a boundary acoustic wave or a Bulk Acoustic Wave (BAW), for example.

In general, as the number of frequency bands (also simply called bands) of the multiplexer increases, a filter having a lower loss is demanded for the reasons that the circuit configuration is more complicated and the length of a transfer line is increased, and that mismatching between circuit elements is increased.

To cope with such a problem, the surface acoustic wave filter is used as each filter in the multiplexer 1 according to the present preferred embodiment. A smaller-sized and lower-loss multiplexer is able to be obtained with the use of the surface acoustic wave filter. Furthermore, in the multiplexer 1 according to the present preferred embodiment, a multilayer body including a high acoustic velocity support substrate, a low acoustic velocity film, and a piezoelectric layer is used as a piezoelectric substrate of the filter 15 for Band41, such that the Q-value of each resonator defining the filter 15 is increased and low loss properties of the filter 15 are ensured. A multilayer structure of the piezoelectric substrate used in the filter 15 and a structure of a surface acoustic wave resonator including an InterDigital Transducer (IDT) electrode provided on the piezoelectric substrate will be described below.

The structure of each resonator in the filter 15, which is preferably provided as a surface acoustic wave filter, will now be described. The serial arm resonators and the parallel arm resonators both defining the filter 15 are each preferably surface acoustic wave (SAW) resonators, for example.

Figure 3:
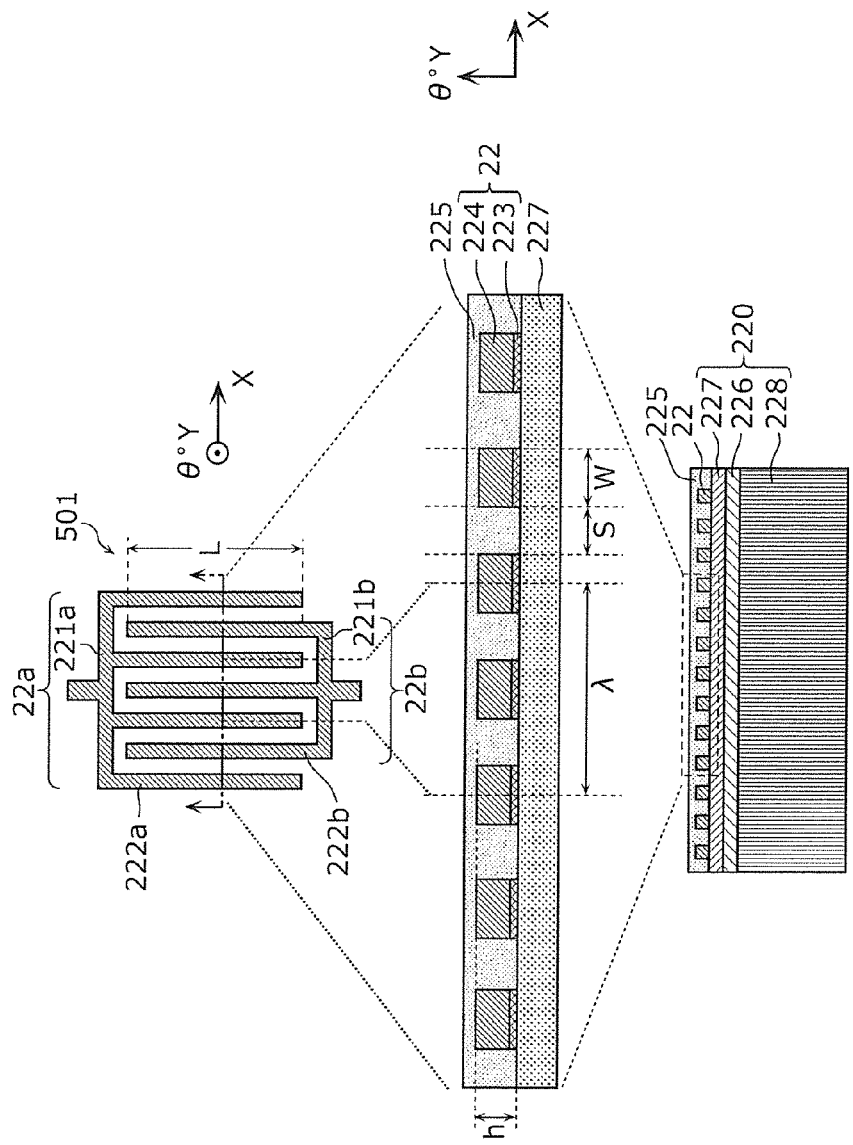
FIG. 3 includes a plan view and sectional views each schematically illustrating a resonator in a surface acoustic wave filter according to a preferred embodiment of the present invention.

FIG. 3 includes a plan view and sectional views each schematically illustrating the resonator in the filter 15 according to the present preferred embodiment. The schematic plan view and the schematic sectional views in FIG. 3 illustrate, by way of example, a structure of the serial arm resonator 501 among the plurality of resonators defining the filter 15. It is to be noted that the serial arm resonator 501 illustrated in FIG. 3 is merely to explain a typical structure of the resonators, and that the number and the length of electrode fingers defining the electrode are not limited to those ones illustrated in the drawings.

Each of the resonators in the filter 15 includes a substrate 220 including a piezoelectric layer 227, and a pair of comb-shaped electrodes 22a and 22b.

As illustrated in the plan view of FIG. 3, the pair of comb-shaped electrodes 22a and 22b opposing to each other are provided on the piezoelectric layer 227. The pair of the comb-shaped electrodes 22a and 22b define an IDT electrode 22. The comb-shaped electrode 22a includes a plurality of electrode fingers 222a parallel or substantially parallel to one another and a busbar 221a interconnecting the electrode fingers 222a. The comb-shaped electrode 22b includes a plurality of electrode fingers 222b parallel or substantially parallel to one another and a busbar 221b interconnecting the electrode fingers 222b. The electrode fingers 222a and 222b are arranged side-by-side along a direction orthogonal or substantially orthogonal to an X-axis direction.

The IDT electrode 22 defined by the electrode fingers 222a and 222b and the busbar electrodes 221a and 221b includes a multilayer structure including a close contact layer 223 and a main electrode layer 224, as illustrated in the sectional views of FIG. 3.

The close contact layer 223 increases adhesion between the piezoelectric layer 227 and the main electrode layer 224. For example, Ti is preferably used as a material of the close contact layer 223. A film thickness of the close contact layer 223 is preferably about 12 nm, for example.

For example, Al containing 1% of Cu is preferably used as a material of the main electrode layer 224. A film thickness of the main electrode layer 224 is preferably about 141 nm, for example.

A protective layer 225 is preferably provided to cover the comb-shaped electrodes 22a and 22b. The protective layer 225, for example, protects the main electrode layer 224 from external environments, adjusts frequency-temperature characteristics, and increases humidity resistance. The protective layer 225 is preferably made of a film containing, as a main ingredient, silicon dioxide ($SiO_2$), for example. A film thickness of the protective layer 225 is preferably about 25 nm, for example.

The materials used to make the close contact layer 223, the main electrode layer 224, and the protective layer 225 are not limited to those described above. The IDT electrode 22 is not always required to have the above-described multilayer structure. In another example, the IDT electrode 22 may be made of a metal such as, for example, Ti, Al, Cu, Pt, Au, Ag or Pd, or an alloy of any of those metals. Alternatively, the IDT electrode 22 may be made using a plurality of multilayer bodies each made of the above-described metal or alloy. The protective layer 225 is not always required to be provided.

The multilayer structure of the substrate 220 will be described below.

As illustrated in a lower zone of FIG. 3, the substrate 220 preferably includes a high acoustic velocity support substrate 228, a low acoustic velocity film 226, and a piezoelectric layer 227. The substrate 220 has a structure in which the high acoustic velocity support substrate 228, the low acoustic velocity film 226, and the piezoelectric layer 227 are successively laminated in this order.

The piezoelectric layer 227 is preferably made of, for example, a θ° Y cut X SAW propagation $LiTaO_3$ piezoelectric single crystal or piezoelectric ceramic (i.e., a lithium tantalate single crystal which is obtained by cutting it along a plane having a normal line defined as an axis resulting from rotating a Y axis toward a Z axis through θ° with an X axis being a center axis, and in which a surface acoustic wave propagates in the X-axis direction or ceramic). Where a wavelength of an acoustic wave, which is determined by an electrode period of the IDT electrode 22, is denoted by λ, a thickness of the piezoelectric layer 227 is preferably not more than about 3.5λ, for example. For instance, in the case of θ=42 (°), the thickness is preferably about 535 nm, for example.

The high acoustic velocity support substrate 228 supports the low acoustic velocity film 226, the piezoelectric layer 227, and the IDT electrode 22. In addition, the high acoustic velocity support substrate 228 is a substrate in which a bulk wave propagates at a higher acoustic velocity than an acoustic wave, such as a surface acoustic wave or a boundary acoustic wave, propagating in the piezoelectric layer 227, and which confines the surface acoustic wave in a region in which the piezoelectric layer 227 and the low acoustic velocity film 226 are laminated, and thus prevents the surface acoustic wave from leaking to the lower side than the high acoustic velocity support substrate 228. The high acoustic velocity support substrate 228 is preferably a silicon substrate, for example, and preferably has a thickness of about 125 μm, for example. The high acoustic velocity support substrate 228 may be made of one among (1) aluminum nitride, aluminum oxide, silicon carbide, silicon nitride, silicon, sapphire, and piezoelectric bodies such as lithium tantalate, lithium niobate, and quartz, (2) various ceramics such as alumina, zirconia, cordierite, mullite, steatite, and forsterite, (3) magnesia diamond, (4) materials containing any of the above-mentioned materials as a main ingredient, and (5) materials containing a mixture of two or more of the above-mentioned materials as a main ingredient.

The low acoustic velocity film 226 is a film in which a bulk wave propagates at a lower acoustic velocity than an acoustic wave propagating in the piezoelectric film 227. The low acoustic-velocity film 226 is between the piezoelectric film 227 and the high acoustic velocity support substrate 228. Energy of the surface acoustic wave is reduced or prevented from leaking to the outside of the IDT electrode due to not only the above-described structure, but also such intrinsic properties of the acoustic wave that the acoustic wave tends to concentrate in a medium having a relatively low acoustic velocity. The low acoustic velocity film 226 is preferably a film containing, for example, silicon dioxide ($SiO_2$) as a main ingredient, for example. Where the wavelength of the acoustic wave, which is determined by the electrode period of the IDT electrode 22, is denoted by λ, a thickness of the low acoustic velocity film 226 is preferably not more than about 2λ, and is preferably about 600 nm, for example.

With the above-described multilayer structure, Q-values of each resonator at a resonant frequency and an anti-resonant frequency are able to be considerably increased in comparison with those obtained with the known structure in which the piezoelectric substrate is made of a single layer. Thus, since a surface acoustic wave resonator having a higher Q-value is able to be provided, a filter with a smaller insertion loss is able to be made using such a surface acoustic wave resonator.

The high acoustic velocity support substrate 228 may have a laminated structure including a support substrate and a high acoustic velocity film in which a bulk wave propagates at a higher acoustic velocity than the acoustic wave, such as the surface acoustic wave and the boundary acoustic wave, propagating in the piezoelectric layer 227. In that case, the support substrate may preferably be made of, for example, sapphire, a piezoelectric body such as lithium tantalate, lithium niobate, or quartz, one of various ceramics such as alumina, magnesia, silicon nitride, aluminum nitride, silicon carbide, zirconia, cordierite, mullite, steatite, and forsterite, a dielectric such as glass, a semiconductor such as silicon or gallium nitride, or a resin. The high acoustic velocity film may preferably be made of one of various high acoustic velocity materials such as aluminum nitride, aluminum oxide, silicon carbide, silicon nitride, silicon oxynitride, a DLC film, and diamond, a medium containing one among those materials as a main ingredient, and a medium containing a mixture of two or more among those materials as a main ingredient.

The thicknesses, the materials, and other features of the individual layers in the above-described multilayer structure of the piezoelectric substrate are merely examples, and they may be changed depending on, for example, one of demanded filter characteristics, which is considered to be important.

In the filter 15 according to the present preferred embodiment, a cut angle θ(°) of the piezoelectric layer 227 made of LiTaO$_3$ is specified by the following formulas using the wavelength λ determined by the repetition period of the comb-shaped electrodes 22a and 22b, a film thickness $T_{IDT}$ of the comb-shaped electrodes 22a and 22b, a specific gravity ρ of the IDT electrode 22, an electrode duty D of the IDT electrode 22, a thickness $T_{LT}$ of the piezoelectric layer 227, and a film thickness $T_{VL}$ of the low acoustic velocity film 226. In the below formula, $θ_B$(°) is an optimum cut angle of the piezoelectric layer 227 at which a Rayleigh wave spurious response is locally minimized.

$$θ_B = 43.09 - 27.5 \times \left\{\left(\frac{T_{IDT}}{λ}\right) \times ρ - 0.1956\right\} -$$
$$19.2 \times (D - 0.5) + 17.4578 \times \left\{\left(\frac{T_{LT}}{λ}\right) - 0.35\right\} +$$
$$5.619 \times \left\{\left(\frac{T_{VL}}{λ}\right) - 0.3\right\} + 32.66 \times \left[\left\{\left(\frac{T_{LT}}{λ}\right) - 0.35\right\}^2 - 0.0125\right] +$$
$$24.63 \times \left\{\left(\frac{T_{LT}}{λ}\right) - 0.35\right\} \times \left\{\left(\frac{T_{VL}}{λ}\right) - 0.3\right\}$$
$$θ_B - 4 ≤ θ ≤ θ_B + 4$$

As a result of conducting intensive studies, the inventors of preferred embodiments of the present invention have discovered that, in the surface acoustic wave filter using the piezoelectric layer made of θ° Y cut X SAW propagation LiTaO$_3$, the cut angle θ at which the occurrence of the Rayleigh wave spurious response in an attenuation band on the lower frequency side than the pass band is able to be reduced or prevented is not uniquely determined and is changed depending on λ, $T_{IDT}$, ρ, D, $T_{LT}$, and $T_{VL}$, and that the cut angle θ is able to be specified by the above formulas.

Thus, the cut angle θ of the LiTaO$_3$ piezoelectric layer 227 is able to be selected depending on the structural parameters of the IDT electrode 22 and the piezoelectric material, and the spurious response in the attenuation band on the lower frequency side than the pass band is able to be reduced. Incidentally, for instance, when pass bands of the filters 11 and 12 on the lower frequency side of the filter 15 overlap with an occurrence frequency of the Rayleigh wave spurious response in the filter 15, ripples in the pass bands of the filters 11 and 12 are able to be reduced.

The transmission filters 11 and 13 and the reception filters 12 and 14 may also each be a SAW filter having the above-described multilayer structure. In that case, lower-loss filter characteristics are able to be achieved in the transmission filters 11 and 13 and the reception filters 12 and 14. In each of the transmission filters 11 and 13 and the reception filters 12 and 14, however, a substrate on or in which an IDT electrode is provided may be a piezoelectric substrate made of a single piezoelectric layer. The piezoelectric substrate in such a case is preferably made of, for example, a piezoelectric single crystal of LiTaO$_3$ or another type of piezoelectric single crystal such as LiNbO$_3$.

The preferred structural parameters of the IDT electrode 22 will now be described. A wavelength of a surface acoustic wave resonator is specified as the wavelength λ, denoted in a middle of FIG. 3, which is determined by the repetition period of the electrode fingers 222a or 222b defining the IDT electrode 22. An electrode pitch is about ½ of the wavelength λ. Assuming that a line width of the electrode fingers 222a or 222b defining the pair of comb-shaped electrodes 22a and 22b is denoted by W, and that a space width between adjacent two of the electrode fingers 222a and 222b is denoted by S, the electrode pitch is defined as (W+S). An intersecting width L of the IDT electrode is, as illustrated in an upper zone of FIG. 3, a length of portions of the electrode fingers 222a of the comb-shaped electrode 22a and the electrode fingers 222b of the comb-shaped electrode 22b, the portions overlapping with each other when viewed from the X-axis direction. The electrode duty D of each resonator implies a line width occupancy of the electrode fingers 222a or 222b, and it is defined as W/(W+S), i.e., a ratio of the line width of the electrode fingers 222a or 222b to an added value of the line width and the space width thereof.

The operating principle of the ladder surface acoustic wave filter according to the present preferred embodiment will be described below.

For instance, each of the parallel arm resonators 551 to 554 illustrated in FIG. 2 has a resonant frequency frp and an anti-resonant frequency fap (>frp) in resonance characteristics. Each of the serial arm resonators 501 to 505 has a resonant frequency frs and an anti-resonant frequency fas (>frs>frp) in resonance characteristics. The resonant frequencies frs of the serial arm resonators 501 to 505 are designed to be matched or substantially matched with each other, but they are not specifically matched. The above point is similarly applied to the anti-resonant frequencies fas of the serial arm resonators 501 to 505, the resonant frequencies frp of the parallel arm resonators 551 to 554, and the anti-resonant frequency fap of the parallel arm resonators 551 to 554. In other words, the resonant and anti-resonant frequencies are also not specifically matched.

When a band pass filter is made using ladder resonators, the anti-resonant frequency fap of the parallel arm resonators 551 to 554 and the resonant frequency frs of the serial arm resonators 501 to 505 are set close to each other. With that setting, an elimination band on the lower frequency side is provided in the vicinity of the resonant frequency frp at which impedances of the parallel arm resonators 551 to 554 approach 0. As the frequency increases from the resonant frequency frp, the impedances of the parallel arm resonators 551 to 554 become higher near the anti-resonant frequency fap and impedances of the serial arm resonators 501 to 505 approach 0 near the resonant frequency frs. Near a region from the anti-resonant frequency fap to the resonant frequency frs, therefore, a signal pass band is obtained in a signal path from the common terminal 60 to the input/output terminal 50. As the frequency further increases and approaches the anti-resonant frequency fas, the impedances of the serial arm resonators 501 to 505 become higher, such that an elimination band on the higher frequency side is provided. Thus, sharpness of attenuation characteristics in the elimination band on the higher frequency side is greatly affected depending on a position at which the anti-resonant frequency fas of the serial arm resonators 501 to 505 is to be set outside the signal pass band.

In the filter 15, when a radio frequency signal is input from the common terminal 60, a potential difference is generated between the common terminal 60 and the ground. As a result, the piezoelectric substrate is distorted and a surface acoustic wave propagating in the X direction is generated. Thus, by setting the wavelength λ of the IDT electrode 22 and the wavelength of the pass band to be matched with each other, only a radio frequency signal having a frequency component to be passed is allowed to pass through the filter 15.

How to derive the cut angle θ(°) of the piezoelectric layer 227 used in the substrate 220 of the filter 15 will be described below.

In the present preferred embodiment, the substrate 220 having the above-described multilayer structure is used as the substrate of the filter 15. Here, LiTaO$_3$ is selected as a material of the piezoelectric layer 227 of the substrate 220 to be adapted for specifications of the band width, insertion loss, and attenuation bands, which are demanded for the filter 15.

However, when a surface acoustic wave filter is made using the piezoelectric layer 227 made of LiTaO$_3$ and having the above-described multilayer structure, a Rayleigh wave spurious response generates on the lower frequency side than the pass band, and attenuation characteristics on the lower frequency side degrade. Furthermore, it is supposed that, when a multiplexer is made using the above-mentioned surface acoustic wave filter, a ripple attributable to the spurious response may generate in a pass band of a lower-frequency-side filter (e.g., the filter 11 or 12), which is connected in common to the surface acoustic wave filter (e.g., the filter 15).

Using a piezoelectric substrate having a particular cut angle is capable of reducing or preventing the spurious response. On the other hand, in the surface acoustic wave filter, the film thickness $T_{IDT}$, the electrode duty D in the pair of comb-shaped electrodes defining the IDT electrode 22, the thickness $T_{LT}$ of the piezoelectric layer 227, and the film thickness $T_{VL}$ of the low acoustic velocity film 226 have to be selected depending on the demanded filter characteristics.

As a result of conducting intensive studies, the inventors of preferred embodiments of the present invention have discovered that, in the surface acoustic wave filter using the piezoelectric layer 227 made of θ° Y cut X SAW propagation LiTaO$_3$, the cut angle θ at which the occurrence of the Rayleigh wave spurious response in the attenuation band on the lower frequency side than the pass band are able to be reduced or prevented is not uniquely determined and is changed depending on the film thickness $T_{IDT}$, the electrode duty D, the thickness $T_{LT}$, and the film thickness $T_{VL}$, and that the Cut angle θ can be specified on the basis of those parameters.

Figure 4A:
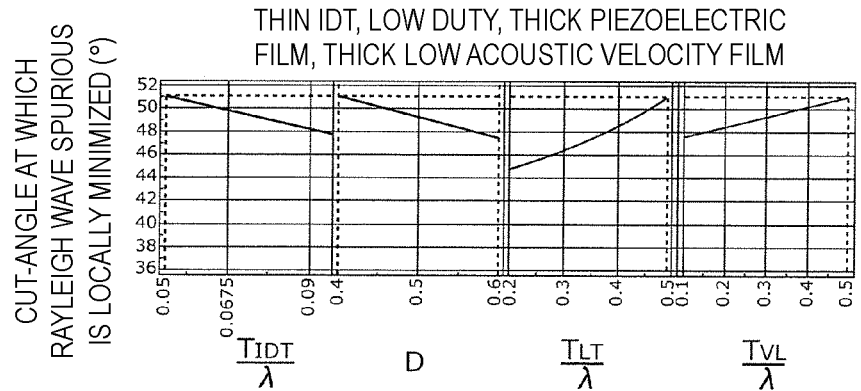
FIG. 4A is a graph representing relationships between structural parameters in a first range and a cut angle of an LT piezoelectric layer.
Figure 4B:
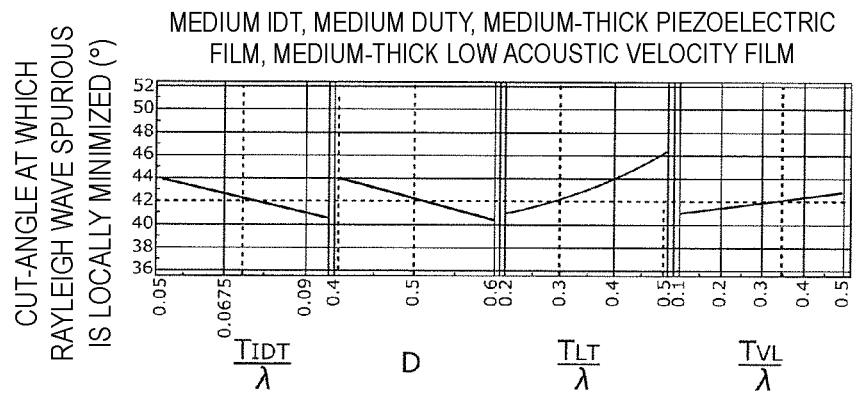
FIG. 4B is a graph representing relationships between the structural parameters in a second range and the Cut angle of the LT piezoelectric layer.
Figure 4C:
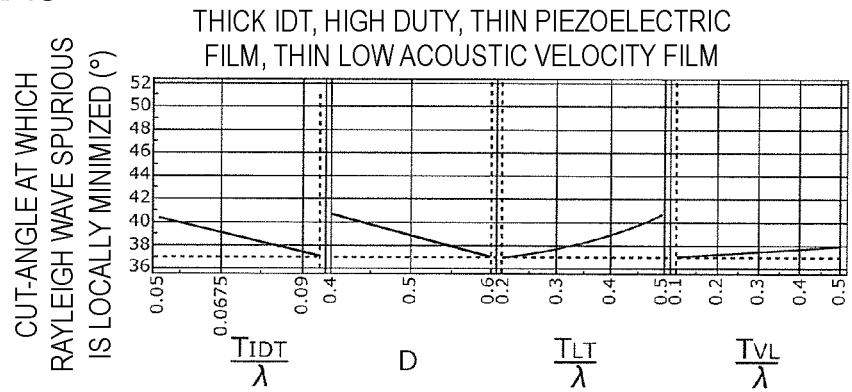
FIG. 4C is a graph representing relationships between the structural parameters in a third range and the Cut angle of the LT piezoelectric layer.

FIG. 4A is a graph representing relationships between the structural parameters in a first range and the cut angle of the piezoelectric layer 227. FIG. 4B is a graph representing relationships between the structural parameters in a second range and the cut angle of the piezoelectric layer 227. FIG. 4C is a graph representing relationships between the structural parameters in a third range and the cut angle of the piezoelectric layer 227. The results illustrated in FIGS. 4A to 4C are obtained by determining, with simulations using the finite element method, changes of the cut angle at which the Rayleigh wave spurious response is locally reduced or minimized, when a normalized film thickness ($T_{IDT}$/λ), the electrode duty D, a normalized thickness ($T_{LT}$/λ), and a normalized film thickness ($T_{VL}$/λ) are changed. In FIGS. 4A to 4C, Al is used as the material of the IDT electrode 22, and SiO$_2$ is used as the material of the low acoustic velocity film 226.

The structural parameters in the first range are given as parameters in a range of the normalized film thickness ($T_{IDT}$/λ), which includes the normalized film thickness ($T_{IDT}$/λ)=about 0.05 and in which the normalized film thickness ($T_{IDT}$/λ) is smaller than those in the second range and the third range, a range of the electrode duty D, which includes the electrode duty D=about 0.4038 and in which the electrode duty D is lower than those in the second range and the third range, a range of the normalized thickness ($T_{LT}$/λ), which includes the normalized thickness ($T_{LT}$/λ)=about 0.4923 and in which the normalized thickness ($T_{LT}$/λ) is larger than those in the second range and the third range, and a range of the normalized film thickness ($T_{VL}$/λ), which includes the normalized film thickness ($T_{VL}$/λ)=about 0.4949 and in which the normalized film thickness ($T_{VL}$/λ) is larger than those in the second range and the third range.

The structural parameters in the third range are given as parameters in a range of the normalized film thickness ($T_{IDT}$/λ), which includes the normalized film thickness ($T_{IDT}$/λ)=about 0.09471 and in which the normalized film thickness ($T_{IDT}$/λ) is larger than those in the first range and the second range, a range of the electrode duty D, which includes the electrode duty D=about 0.5974 and in which the electrode duty D is higher than those in the first range and the second range, a range of the normalized thickness ($T_{LT}$/λ), which includes the normalized thickness ($T_{LT}$/λ)= about 0.2058 and in which the normalized thickness ($T_{LT}$/λ) is smaller than those in the first range and the second range, and a range of the normalized film thickness ($T_{VL}$/λ), which includes the normalized film thickness ($T_{VL}$/λ)=about 0.1077 and in which the normalized film thickness ($T_{VL}$/λ) is smaller than those in the first range and the second range.

The structural parameters in the second range are given as parameters in a range of the normalized film thickness ($T_{IDT}$/λ), which includes the normalized film thickness ($T_{IDT}$/λ)=about 0.0725 and in which the normalized film thickness ($T_{IDT}$/λ) is larger than that in the first range and smaller than that in the third range, a range of the electrode duty D, which includes the electrode duty D=about 0.5 and in which the electrode duty D is higher than that in the first range and lower than that in the third range, a range of the normalized thickness ($T_{LT}$/λ), which includes the normalized thickness ($T_{LT}$/λ)=about 0.3 and in which the normalized thickness ($T_{LT}$/λ) is smaller than that in the first range and larger than that in the third range, and a range of the normalized film thickness ($T_{VL}$/λ), which includes the normalized film thickness ($T_{VL}$/λ)=about 0.35 and in which the normalized film thickness ($T_{VL}$/λ) is smaller than that in the first range and larger than that in the third range.

As commonly shown in FIGS. 4A to 4C, as the normalized film thickness ($T_{IDT}$/λ) increases, the cut angle decreases. As the electrode duty D increases, the cut angle decreases. As the normalized thickness ($T_{LT}$/λ) increases, the cut angle increases. As the normalized film thickness ($T_{VL}$/λ) increases, the cut angle increases.

As illustrated in FIG. 4A, when the structural parameters in the first range fall in a smaller zone (=about 0.05) within the range of the normalized film thickness ($T_{IDT}$/λ), a lower zone (=about 0.4038) within the range of the electrode duty D, a larger zone (=about 0.4923) within the range of the normalized thickness ($T_{LT}$/λ), and a larger zone (=about 0.4949) within the range of the normalized film thickness ($T_{VL}/\lambda$), about 51° is obtained as the cut angle at which the Rayleigh wave spurious response is locally reduced or minimized.

As illustrated in FIG. 4B, when the structural parameters in the second range fall in a medium zone (=about 0.0725) within the range of the normalized film thickness ($T_{IDT}/\lambda$), a medium zone (=about 0.5) within the range of the electrode duty D, a medium zone (=about 0.3) within the range of the normalized thickness ($T_{LT}/\lambda$), and a medium zone (=about 0.35) within the range of the normalized film thickness ($T_{VL}/\lambda$), about 42° is obtained as the cut angle at which the Rayleigh wave spurious response is locally reduced or minimized.

As illustrated in FIG. 4C, when the structural parameters in the third range fall in a larger zone (=about 0.09471) in the range of the normalized film thickness ($T_{IDT}/\lambda$), a higher zone (=about 0.5974) within the range of the electrode duty D, a smaller zone (=about 0.2058) within the range of the normalized thickness ($T_{LT}/\lambda$), and a smaller zone (=about 0.1077) within the range of the normalized film thickness ($T_{VL}/\lambda$), about 37° is obtained as the cut angle at which the Rayleigh wave spurious response is locally reduced or minimized.

Figure 5A:
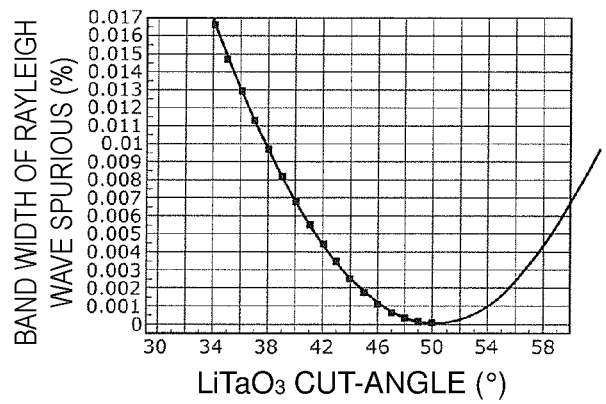
FIG. 5A is a graph representing a relationship between the cut angle of the LT piezoelectric layer and a band width of a Rayleigh wave spurious response in the case of using the structural parameters in the first range.
Figure 5B:
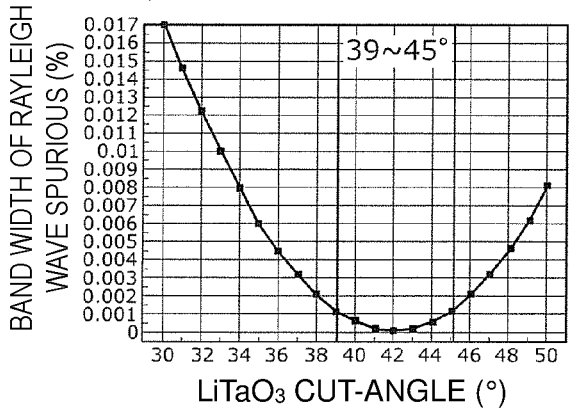
FIG. 5B is a graph representing a relation between the cut angle of the LT piezoelectric layer and the band width of the Rayleigh wave spurious response in the case of using the structural parameters in the second range.
Figure 5C:
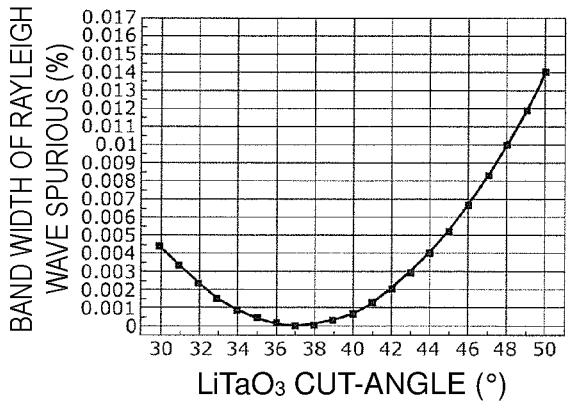
FIG. 5C is a graph representing a relation between the cut angle of the LT piezoelectric layer and the band width of the Rayleigh wave spurious response in the case of using the structural parameters in the third range.

FIG. 5A is a graph representing a relationship between the cut angle of the piezoelectric layer 227 and a band width BW of the Rayleigh wave spurious response in the case of using the structural parameters in the first range. FIG. 5B is a graph representing a relationship between the cut angle of the piezoelectric layer 227 and the band width BW of the Rayleigh wave spurious response in the case of using the structural parameters in the second range. FIG. 5C is a graph representing a relationship between the cut angle of the piezoelectric layer 227 and the band width BW of the Rayleigh wave spurious response in the case of using the structural parameters in the third range. In the filter having the ladder filter structure as in the filter 15 used in the present preferred embodiment, because each of the serial arm resonators and the parallel arm resonators generates a spurious response near a 0.76-time frequency band, a spurious response having a predetermined band width BW generates due to a spurious response corresponding to the resonance point (anti-resonance point) of each serial arm resonator and a spurious response corresponding to the resonance point (anti-resonance point) of each parallel arm resonator.

As illustrated in FIG. 5A, when the structural parameters in the first range fall in the smaller zone (=about 0.05) within the range of the normalized film thickness ($T_{IDT}/\lambda$), the lower zone (=about 0.4038) within the range of the electrode duty D, the large zone (=about 0.4923) within the range of the normalized thickness ($T_{LT}/\lambda$), and the larger zone (=about 0.4949) within the range of the normalized film thickness ($T_{VL}/\lambda$), about 50° is obtained as the cut angle at which the band width BW of the Rayleigh wave spurious response is locally reduced or minimized.

As illustrated in FIG. 5B, when the structural parameters in the second range fall in the medium zone (=about 0.0725) within the range of the normalized film thickness ($T_{IDT}/\lambda$), the medium zone (=about 0.5) within the range of the electrode duty D, the medium zone (=about 0.3) within the range of the normalized thickness ($T_{LT}/\lambda$)), and the medium zone (=about 0.35) within the range of the normalized film thickness ($T_{VL}/\lambda$), about 42° is obtained as the cut angle at which the band width BW of the Rayleigh wave spurious response is locally reduced or minimized.

As illustrated in FIG. 5C, when the structural parameters in the third range fall in the larger zone (=about 0.09471) within the range of the normalized film thickness ($T_{IDT}/\lambda$), the higher zone (=about 0.5974) within the range of the electrode duty D, the smaller zone (=about 0.2058) within the range of the normalized thickness ($T_{LT}/\lambda$), and the small zone (=about 0.1077) within the range of the normalized film thickness ($T_{VL}/\lambda$), about 37° is obtained as the cut angle at which the band width BW of the Rayleigh wave spurious response is locally reduced or minimized.

Thus, as illustrated in FIGS. 4A to 4C and FIGS. 5A to 5C, the cut angle at which the level and the band width of the Rayleigh wave spurious response is locally reduced or minimized is changed depending on combination of the normalized film thickness ($T_{IDT}/\lambda$), the electrode duty D, the normalized thickness ($T_{LT}/\lambda$), and the normalized film thickness ($T_{VL}/\lambda$).

The above-described formulas are derived by analyzing, with a data analysis tool, not only the data illustrated in FIGS. 4A to 4C and FIG. 5A to 5C, but also other data similarly representing the relationships of the normalized film thickness ($T_{IDT}/\lambda$), the electrode duty D, the normalized thickness ($T_{LT}/\lambda$), and the normalized film thickness ($T_{VL}/\lambda$) with respect to the cut angle $\theta_B$ at which the level and the band width BW of the Rayleigh wave spurious response are locally reduced or minimized. In other words, the cut angle $\theta_B$ is changed depending on the film thickness $T_{IDT}$, the electrode duty D, the thickness $T_{LT}$, and the film thickness $T_{VL}$. Thus, the cut angle $\theta_B$ is not uniquely determined and is determined by the above formulas.

In the above formulas, ρ denotes the specific gravity of the IDT electrode 22. For instance, when the IDT electrode 22 is made of Al, ρ=about 2.6989 (g/cm$^3$) may be provided. When the IDT electrode 22 is made of Ti, ρ=about 4.54 (g/cm$^3$) may be provided. When the IDT electrode 22 is made of Pt, ρ=about 21.45 (g/cm$^3$) may be provided.

Bandpass characteristics of the multiplexer 1 according to the present preferred embodiment will be described below in comparison with a filter according to a Comparative Example.

Figure 6A:
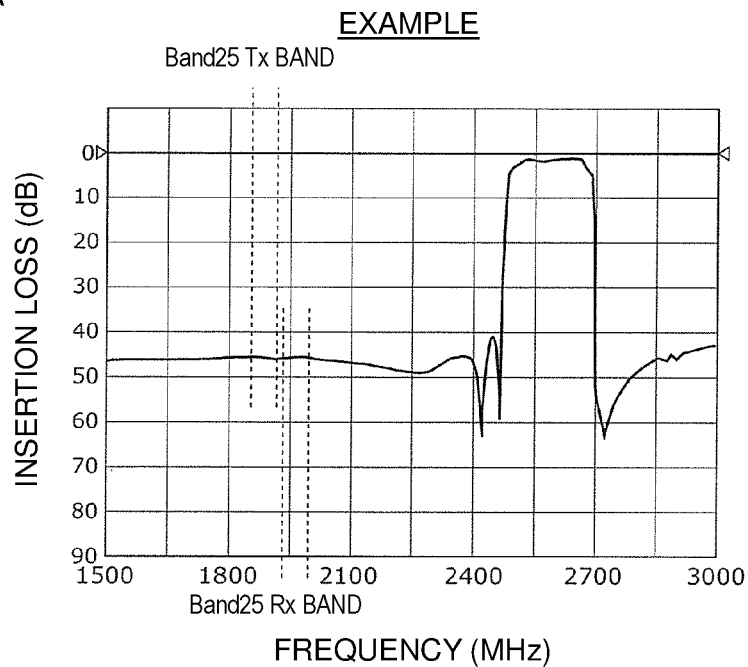
FIG. 6A is a graph representing bandpass characteristics of a filter for Band41 according to an Example of a preferred embodiment of the present invention.
Figure 6B:
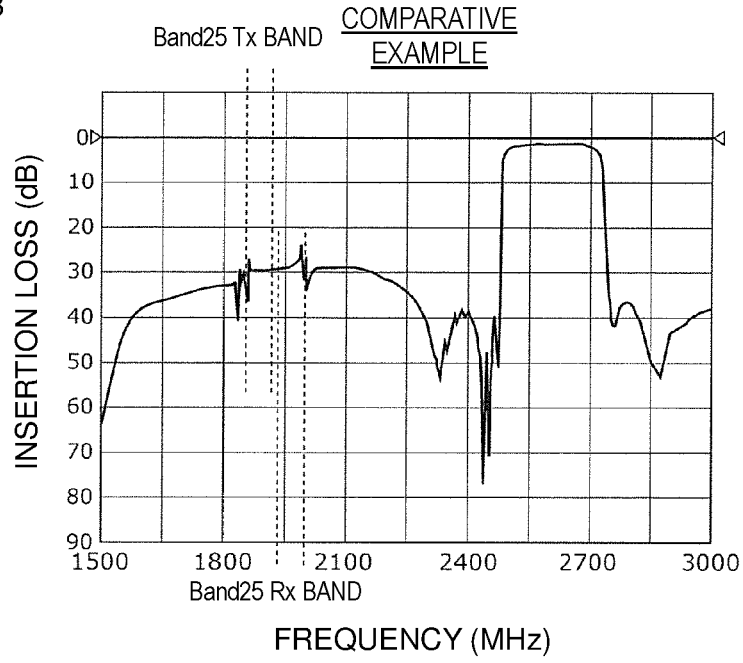
FIG. 6B is a graph representing bandpass characteristics of a filter for Band41 according to a Comparative Example.
Figure 7:
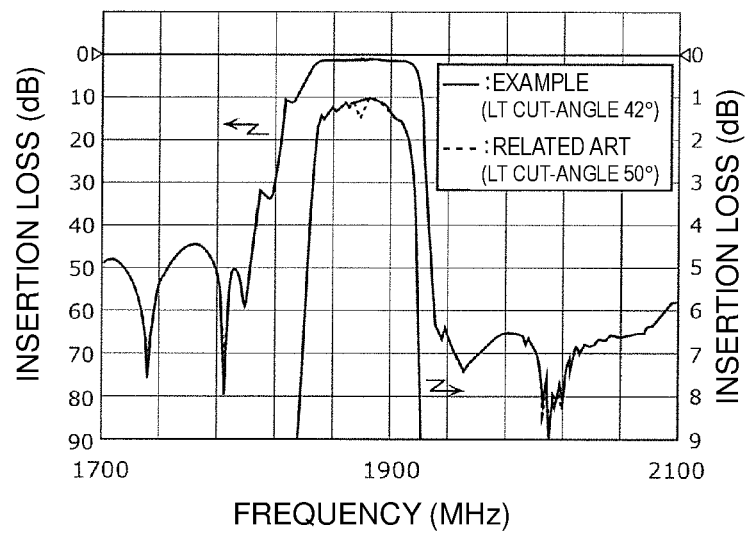
FIG. 7 is a graph comparatively representing bandpass characteristics of transmission filters for Band25 according to the Example and the Comparative Example.

FIG. 6A is a graph representing bandpass characteristics of the filter 15 for Band41 according to an Example of a preferred embodiment of the present invention. FIG. 6B is a graph representing bandpass characteristics of a filter for Band41 according to the Comparative Example. FIG. 7 is a graph comparatively representing bandpass characteristics of transmission filters for Band25 according to the Example and the Comparative Example. Furthermore, Table 1 lists design parameters of the filter 15 according to the Example.

TABLE 1

|  | Parallel Arm Resonator 554 | Parallel Arm Resonator 553 | Parallel Arm Resonator 552 | Parallel Arm Resonator 551 |
| --- | --- | --- | --- | --- |
| Wavelength λ (μm) | 1.4765 | 1.4563 | 1.4528 | 1.4715 |
| Electrode Duty | 0.5 | 0.5 | 0.5 | 0.5 |
| Number of Finger Pairs (pair) | 136 | 173 | 267 | 162 |
| Intersecting Width (μm) | 15.1 | 19.3 | 15.6 | 31.8 |

TABLE 1-continued

|  | Serial Arm Resonator 505 | Serial Arm Resonator 504 | Serial Arm Resonator 503 | Serial Arm Resonator 502 | Serial Arm Resonator 501 |
|---|---|---|---|---|---|
| Wavelength λ (μm) | 1.3497 | 1.3780 | 1.3848 | 1.3785 | 1.3317 |
| Electrode Duty | 0.5 | 0.5 | 0.5 | 0.5 | 0.5 |
| Number of Finger Pairs (pair) | 130 | 200 | 287 | 210 | 140 |
| Intersecting Width (μm) | 15.0 | 15.6 | 15.0 | 15.6 | 15.0 |
| IDT Film Thickness (nm) |  |  | 141 |  |  |
| Piezoelectric Layer Film Thickness (nm) |  |  | 535 |  |  |
| Low Acoustic Velocity Film (nm) |  |  | 600 |  |  |

With respect to the filter 15 according to the Example, about 42(°) is derived as the preferred cut angle $\theta_B$ at which the Rayleigh wave spurious response is locally reduced or minimized, by substituting, into the above formulas, the wavelength λ, the electrode duty D, the film thickness $T_{IDT}$ of the IDT electrode 22, the thickness ($T_{LT}/\lambda$) of the piezoelectric layer 227, the film thickness ($T_{VL}/\lambda$) of the low acoustic velocity film, and the specific gravity ρ of Al defining the IDT electrode 22, which are listed in Table 1. Thus, about 42° Y cut X SAW propagation LiTaO₃ is used as the piezoelectric layer 227 in the filter 15 according to the Example.

On the other hand, in the filter according to the Comparative Example, about 50° Y cut X SAW propagation LiTaO₃ is used which has the cut angle larger than that used in the filter 15 according to the Example by about 8(°). Thus, a cut angle departing from the preferred cut angle $\theta_B$, which is obtained by substituting, into the above formulas, the wavelength λ, the electrode duty D, the film thickness $T_{IDT}$ of the IDT electrode 22, the thickness ($T_{LT}/\lambda$) of the piezoelectric layer 227, and the film thickness ($T_{VL}/\lambda$) of the low acoustic velocity film, is used in the filter according to the Comparative Example. It is to be noted that, when the cut angle of LiTaO₃ is changed, the band width ratio in a main mode is greatly changed, and that desired characteristics in the pass band cannot be obtained unless the circuit configuration and the design parameters of the IDT electrode are greatly changed. Therefore, the design parameters of the filter according to the Comparative Example and the design parameters of the filter 15 according to Example are not the same.

As seen from FIG. 6A, in the bandpass characteristics of the filter 15 according to Example, there are no Rayleigh wave spurious responses in the transmission band and the reception band of Band25. Thus, the filter 15 according to the Example improves an attenuation in the attenuation band on the lower frequency side than the pass band.

On the other hand, as seen from FIG. 6B, in the bandpass characteristics of the filter according to the Comparative Example, there are Rayleigh wave spurious responses in the transmission band and the reception band of Band25. Thus, in the filter for Band41 according to the Comparative Example, the attenuation in the attenuation band on the lower frequency side than the pass band degrades.

Furthermore, as illustrated in FIG. 7, when the filter for Band41 according to the Comparative Example is used in a pentaplexer (multiplexer) for Band25+Band66+Band41, a large ripple is generated in a pass band of the transmission filter for Band25.

In contrast, when the filter 15 for Band41 according to the Example is used in the pentaplexer (i.e., the multiplexer 1) for Band25+Band66+Band41, the ripple in the pass band of the transmission filter 11 for Band25 is reduced or prevented.

The reasons why the above-described advantageous effects have been obtained in the multiplexer 1 according to Example will be described below with reference to FIGS. 8A and 8B.

Figure 8A:
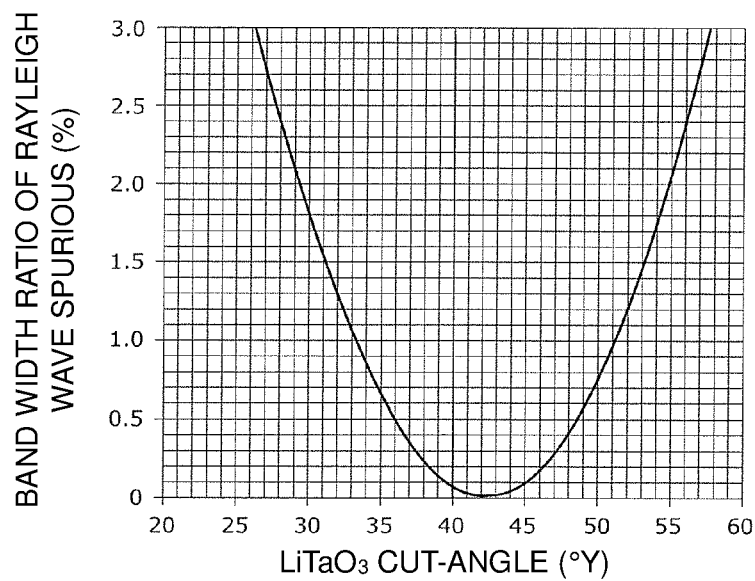
FIG. 8A is a graph representing an example of the relationship between the cut angle of the LT piezoelectric layer and a band width ratio of the Rayleigh wave spurious response.

FIG. 8A is a graph representing an example of a relationship between the cut angle of the LiTaO₃ piezoelectric layer and the band width ratio of the Rayleigh wave spurious response. FIG. 8B is a graph representing an example of a relationship between the cut angle of the LiTaO₃ piezoelectric layer and a level of the Rayleigh wave spurious response. More specifically, FIGS. 8A and 8B are each graphs representing a relationship between the cut angle of the LiTaO₃ piezoelectric layer and the Rayleigh wave spurious response in the case of using the multilayer substrate in the combination of IDT electrode/piezoelectric layer/low acoustic velocity film/high acoustic velocity support substrate, and using the structural parameters in the second range illustrated in FIGS. 4B and 5B.

In FIG. 8A, as the band width ratio (band width BW of Rayleigh wave spurious response/spurious response occurrence frequency) approaches zero, the Rayleigh wave spurious response converges to zero. As seen from FIG. 8A, the band width ratio of the Rayleigh wave spurious response is about zero near the cut angle of about 42(°). On the other hand, the band width ratio is about 0.72% at the cut angle of about 50(°) used in the filter according to the Comparative Example. Thus, it is understood that the Rayleigh wave spurious response is not generated in the filter 15 according to the Example because the band width ratio of the Rayleigh wave spurious response is about zero, whereas the Rayleigh wave spurious response is generated in the filter according to the Comparative Example because the band width ratio is larger than that in the Example.

Figure 8B:
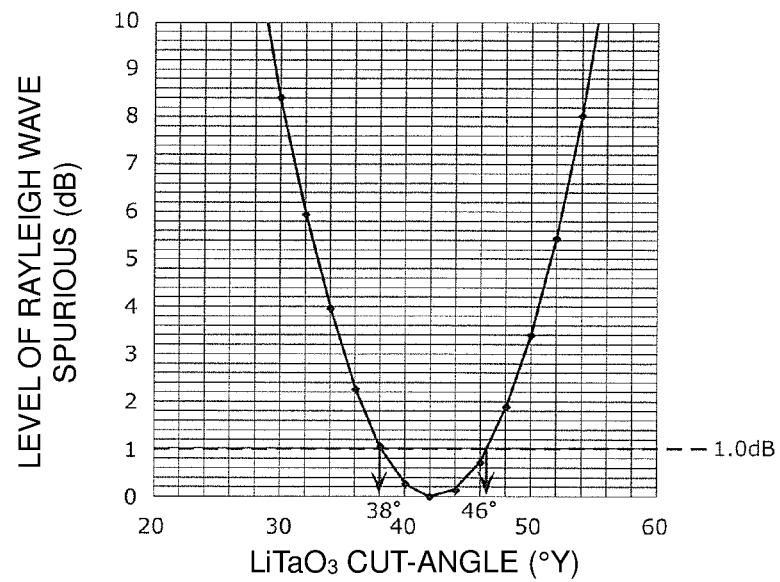
FIG. 8B is a graph representing an example of the relationship between the cut angle of the LT piezoelectric layer and a level of the Rayleigh wave spurious response.

FIG. 8B illustrates the result of checking the level (return loss at the common terminal 60) of the Rayleigh wave spurious response. Similarly to a tendency in FIG. 8A, the Rayleigh wave spurious response is about zero near the cut angle of about 42 (°) of the LiTaO₃ piezoelectric layer, and the level of the Rayleigh wave spurious response increases in either of the cases that the cut angle increases and decreases from about 42 (°). It is to be noted that a ripple corresponding to about 30% of the level of the Rayleigh wave spurious response is generated in the pass bands of the transmission filter 11 and the reception filter 12 for Band25. Recently, because 16QAM and 64QAM are used as modulation methods in a cellular phone system, more advanced specifications are demanded for the ripple in the pass band, and the ripple is desired to be not more than about 0.3 dB, for example. In other words, the level of the Rayleigh wave spurious response is preferably not more than about 1.0 dB, for example.

As seen from FIG. 8B, when the preferred cut angle of the LiTaO$_3$ piezoelectric layer is about 42°, a range of the cut angle θ at which the level of the Rayleigh wave spurious response is able to be held to not more than about 1.0 dB is from about 38° to about 46° (42±4°).

Thus, the ripple of not more than about 0.3 dB, which does not cause a problem in the cellular phone system, is able to be achieved in a range of ±4° from the Cut angle θ$_B$ calculated from the above-described formulas, at which the Rayleigh wave spurious response is not generate (namely, at which it is locally reduced or minimized).

Stated in another way, in the filter 15 according to the present preferred embodiment, the optimum Cut angle θ$_B$(°) of the LiTaO$_3$ piezoelectric layer 227 at which the Rayleigh wave spurious response is locally reduced or minimized is derived by substituting, into the above formulas, the wavelength λ, the film thickness T$_{IDT}$, the specific gravity ρ, the electrode duty D, the thickness T$_{LT}$, and the film thickness T$_{VL}$. On that occasion, the Cut angle θ(°) of the LiTaO$_3$ piezoelectric layer 227 satisfies the relationship of the above-described formulas.

Frequencies about 0.76 times those of Band41 (pass band: about 2496 MHz to about 2690 MHz) overlap with those of Band25 (transmission band: about 1850 MHz to about 1915 MHz, reception band: about 1930 MHz to about 1995 MHz). In such a situation, when the surface acoustic wave filter (i.e., the filter 15) is applied to Band41 and the lower-frequency-side filters (i.e., the transmission filter 11 and the reception filter 12) are applied to Band25, the spurious response in a frequency band about 0.76 times the pass band of the surface acoustic wave filter is reduced or prevented with high accuracy, such that the ripples in the pass bands of the lower-frequency-side filters are able to be reduced. As a result, the multiplexer 1 with a low loss, high attenuation, and high isolation is able be obtained.

Although, in the filter 15 according to the Example, about 42(°) is provided, by way of example, as the preferred cut angle θ$_B$(°) derived from the structural parameters in the second range, the Cut angle θ of the LiTaO$_3$ piezoelectric layer, which is used in the surface acoustic wave filter according to the present preferred embodiment, is preferably derived from the above-described formulas. Thus, when the cut angle θ is calculated using the structural parameters in the first range and the formulas, θ=51±4(°) is derived by way of example. When the cut angle θ is calculated using the structural parameters in the third range and the above formulas, θ=37±4(°) is derived by way of example.

Thus, in the surface acoustic wave filter having the pass band on the high frequency side, the cut angle θ of the LiTaO$_3$ piezoelectric layer is able to be selected depending on the structural parameters of the IDT electrode and the piezoelectric material by using the above-described formulas. As a result, the spurious response level in the pass band of the lower-frequency-side filter is able to be reduced to a value close to, or at, 0. Furthermore, in the lower-frequency-side filter, the ripple in the pass band is able to be reduced.

Although the surface acoustic wave filters and the multiplexers according to preferred embodiments of the present invention have been described above in connection with examples, the present invention is not limited to the above-described examples of preferred embodiments of the present invention. For instance, the following modifications of the above-described examples also fall within the scope of the present invention.

In an alternative example, the multiplexer 1 according to a preferred embodiment of the present invention may further include an impedance matching element that is disposed between the antenna element 2 and the common terminal 60.

Furthermore, the multiplexer 1 according to a preferred embodiment of the present invention is not limited to the pentaplexer for Band25+Band66+Band41 as described in the above-described preferred embodiment. A single surface acoustic wave filter in which the LiTaO$_3$ piezoelectric layer having the cut angle θ specified by the above formulas is used in the multilayer body forming the piezoelectric substrate, as in the filter 15 according to the preferred embodiment, also falls within the scope of the present invention. In such a case, since the Cut angle θ of the LiTaO$_3$ piezoelectric layer can be selected depending on the structural parameters of the IDT electrode and the piezoelectric material, it is possible to provide a surface acoustic wave filter in which the spurious response in the attenuation band on the lower frequency side than the pass band is reduced.

The multiplexer 1 according to a preferred embodiment of the present invention is need only be a multiplexer in which a surface acoustic wave filter including the piezoelectric substrate made of the above-described multilayer body and using the LiTaO$_3$ piezoelectric layer, which has the cut angle θ specified by the above formulas, and a lower-frequency-side filter having a pass band on the lower frequency side than a pass band of the relevant surface acoustic wave filter are connected in common at a common terminal.

The multiplexer 1 according to a preferred embodiment of the present invention may not have the configuration including a plurality of duplexers each performing transmission and reception. For instance, the multiplexer 1 may be applied to a transmission device having a plurality of transmission frequency bands. The multiplexer 1 may be further applied to a reception device having a plurality of reception frequency bands. Those transmission device and reception device also provide similar advantageous effects to those obtained with the multiplexer 1 according to the above-described preferred embodiment.

Preferred embodiments of the present invention may be implemented as a low-loss surface acoustic wave filter or a multiplexer each adaptable for the multi-band and multi-mode frequency standards, and may be widely utilized in communication devices, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave filter comprising:
   a LiTaO$_3$ piezoelectric layer having a cut angle θ°;
   a high acoustic velocity support substrate in which a bulk wave propagates at a higher acoustic velocity than an acoustic wave propagating in the LiTaO$_3$ piezoelectric layer;
   a low acoustic velocity film between the high acoustic velocity support substrate and the LiTaO$_3$ piezoelectric layer, and in which a bulk wave propagates at a lower acoustic velocity than the acoustic wave propagating in the LiTaO$_3$ piezoelectric film; and
   an InterDigital Transducer (IDT) electrode on the LiTaO$_3$ piezoelectric layer; wherein a repetition period of a pair of comb-shaped electrodes defining the IDT electrode is denoted by a wavelength λ (μm), a film thickness of the pair of comb-shaped electrodes is denoted by $T_{IDT}$ (µm), a specific gravity of the IDT electrode is denoted by ρ (g/cm$^3$), an electrode duty of the pair of comb-shaped electrodes is denoted by D, a thickness of the LiTaO$_3$ piezoelectric layer is denoted by $T_{LT}$ (µm), a film thickness of the low acoustic velocity film is denoted by $T_{VL}$ (µm), and a cut angle $\theta_B(°)$ of the LiTaO$_3$ piezoelectric layer at which a Rayleigh wave spurious response is locally reduced or minimized is specified by:

$$\theta_B = 43.09 - 27.5 \times \left\{ \left( \frac{T_{IDT}}{\lambda} \right) \times \rho - 0.1956 \right\} -$$
$$19.2 \times (D - 0.5) + 17.4578 \times \left\{ \left( \frac{T_{LT}}{\lambda} \right) - 0.35 \right\} +$$
$$5.619 \times \left\{ \left( \frac{T_{VL}}{\lambda} \right) - 0.3 \right\} + 32.66 \times \left[ \left\{ \left( \frac{T_{LT}}{\lambda} \right) - 0.35 \right\}^2 - 0.0125 \right] +$$
$$24.63 \times \left\{ \left( \frac{T_{LT}}{\lambda} \right) - 0.35 \right\} \times \left\{ \left( \frac{T_{VL}}{\lambda} \right) - 0.3 \right\}$$

and, the cut angle θ(°) of the LiTaO$_3$ piezoelectric layer satisfies a relationship of:

$\theta_B - 4 \leq \theta \leq \theta_B + 4$.

2. The surface acoustic wave filter according to claim 1, wherein the surface acoustic wave filter includes a ladder filter structure defined by a serial arm resonator and a parallel arm resonator each including the LiTaO$_3$ piezoelectric layer and the IDT electrode.

3. The surface acoustic wave filter according to claim 1, wherein the surface acoustic wave filter has a longitudinally-coupled filter structure including a plurality of acoustic wave resonators each including the LiTaO$_3$ piezoelectric layer and the IDT electrode arranged side-by-side in a propagation direction of the acoustic wave.

4. A multiplexer comprising:
a common terminal;
a first input/output terminal;
a second input/output terminal;
the surface acoustic wave filter according to claim 1, which is connected between the common terminal and the first input/output terminal; and
a lower-frequency-side filter connected between the common terminal and the second input/output terminal, and having a pass band on lower frequency side than a pass band of the surface acoustic wave filter.

5. The multiplexer according to claim 4, wherein
the pass band of the surface acoustic wave filter is a frequency band of Long Term Evolution (LTE) Band41; and
the pass band of the lower-frequency-side filter is a frequency band of LTE Band25.

6. The multiplexer according to claim 4, further comprising an additional surface acoustic wave filter having a pass band with a frequency band of LTE Band66.

7. The multiplexer according to claim 6, wherein
the surface acoustic wave filter is connected between a first input/output terminal and a common terminal;
the lower-frequency-side filter is connected between a second input/output terminal and the common terminal; and
an additional surface acoustic wave filter is connected between a third input/output terminal and the common terminal.

8. The surface acoustic wave filter according to claim 1, wherein the surface acoustic wave filter includes a ladder filter structure defined by a plurality of serial arm resonators, a plurality of parallel arm resonators, and a matching inductor.

9. The surface acoustic wave filter according to claim 8, wherein
the plurality of serial arm resonators are connected in series;
the plurality of parallel arm resonators are respectively connected between pairs of the serial arm resonators and a ground; and
the inductor is connected between at least one of the plurality of parallel arm resonators and the ground.

10. The surface acoustic wave filter according to claim 9, wherein one of the plurality of parallel arm resonators is connected directly to the ground.

11. The surface acoustic wave filter according to claim 2, wherein the serial arm resonator and the parallel arm resonator are both surface acoustic wave resonators.

12. The surface acoustic wave filter according to claim 1, wherein the IDT electrode is defined by opposed electrode fingers having a multilayer structure including a close contact layer and a main electrode layer.

13. The surface acoustic wave filter according to claim 12, wherein
the close contact layer is made of Ti; and
a thickness of the close contact layer is about 12 nm.

14. The surface acoustic wave filter according to claim 12, wherein
the main electrode layer is made of at least of Al and Cu; and
a thickness of the main electrode layer is about 141 nm.

15. The surface acoustic wave filter according to claim 12, wherein the opposed electrode fingers are covered by a protective film containing silicon dioxide.

16. The surface acoustic wave filter according to claim 1, wherein the high acoustic velocity support substrate is a silicon substrate having a thickness of about 125 µm.

17. The surface acoustic wave filter according to claim 1, wherein the low acoustic velocity film is made of silicon dioxide as a main ingredient and has a thickness of about 600 nm.

18. The surface acoustic wave filter according to claim 8, wherein resonant frequencies of the plurality of serial arm resonators are different from one another.

19. The multiplexer according to claim 4, wherein the multiplexer is a pentaplexer for LTE Band25, LTE Band66, and LTE Band41.

20. The surface acoustic wave filter according to claim 1, wherein a spurious response level in the pass band of the lower-frequency-side filter is about 0.

* * * * *